US006191945B1

(12) United States Patent
Belady et al.

(10) Patent No.: US 6,191,945 B1
(45) Date of Patent: *Feb. 20, 2001

(54) COLD PLATE ARRANGEMENT FOR COOLING PROCESSOR AND COMPANION VOLTAGE REGULATOR

(75) Inventors: Christian L. Belady, McKinney, TX (US); S. Daniel Cromwell, Penryn, CA (US)

(73) Assignee: Hewlett-Packard Company, Palo Alto, CA (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/240,266

(22) Filed: Jan. 29, 1999

Related U.S. Application Data

(63) Continuation-in-part of application No. 08/902,770, filed on Jul. 30, 1997.

(51) Int. Cl.[7] ........................................................ H05K 7/20
(52) U.S. Cl. .................... 361/704; 361/697; 361/699; 361/703; 165/104.33; 174/16.3; 257/722
(58) Field of Search .......................... 361/676, 697–699, 361/714–718, 719, 722, 691, 702–710; 257/706–727; 165/80.3, 80.4, 104.33, 104.34, 185; 29/890.03, 890.038, 840, 890.05, 890.04, 739; 324/72.5, 754, 840, 739, 890.05; 439/66; 174/16.3, 15.2, 252

(56) References Cited

U.S. PATENT DOCUMENTS

| | | | |
|---|---|---|---|
| 4,067,237 | 1/1978 | Arcella | 73/204 |
| 4,120,019 | 10/1978 | Arii et al. | 361/385 |
| 4,638,854 | 1/1987 | Noren | 165/76 |
| 4,675,783 | 6/1987 | Murase et al. | 361/385 |
| 4,829,432 | 5/1989 | Hershberger et al. | 361/424 |
| 4,858,093 | 8/1989 | Sturgeon | 363/20 |
| 4,938,280 | * 7/1990 | Clark | 165/80.4 |
| 4,951,740 | 8/1990 | Peterson et al. | 165/32 |
| 4,975,825 | 12/1990 | Huss et al. | 363/141 |
| 5,010,292 | 4/1991 | Lyle, Jr. | 323/274 |
| 5,088,005 | 2/1992 | Ciaccio | 361/385 |
| 5,118,925 | 6/1992 | Mims et al. | 250/213 |
| 5,131,859 | 7/1992 | Bowen et al. | 439/194 |
| 5,136,119 | 8/1992 | Leyland | 174/35 R |
| 5,144,531 | * 9/1992 | Go et al. | 361/382 |
| 5,162,974 | 11/1992 | Currie | 361/385 |
| 5,311,397 | 5/1994 | Harshberger et al. | 361/683 |
| 5,313,099 | 5/1994 | Tata et al. | 257/717 |
| 5,339,214 | 8/1994 | Nelson | 361/695 |
| 5,398,822 | 3/1995 | McCarthy et al. | 211/41 |
| 5,461,541 | 10/1995 | Wentland, Jr. et al. | 361/707 |
| 5,475,606 | 12/1995 | Muyshondt et al. | 364/489 |
| 5,504,650 | 4/1996 | Katsui et al. | 361/697 |
| 5,508,908 | 4/1996 | Kazama et al. | 363/141 |
| 5,513,070 | 4/1996 | Xie et al. | 361/700 |
| 5,522,602 | 6/1996 | Kaplo et al. | 277/53 |
| 5,579,827 | 12/1996 | Chung | 165/80.3 |
| 5,587,920 | 12/1996 | Muyshondt et al. | 364/489 |
| 5,592,391 | 1/1997 | Muyshondt et al. | 364/489 |
| 5,598,320 | 1/1997 | Toedtman et al. | 361/687 |
| 5,621,635 | 4/1997 | Takiar | 363/141 |
| 5,801,924 | 9/1998 | Salmonson | 361/719 |

* cited by examiner

*Primary Examiner*—Leo P. Picard
*Assistant Examiner*—Michael Datskovsky
(74) *Attorney, Agent, or Firm*—Jack A. Lenell

(57) ABSTRACT

A compact cooling method and apparatus arranged for simultaneously drawing heat from both a processor and from the voltage regulator. The invention provides for advantageous arrangement of the voltage regulator and memory proximate to the processor for high speed operation. The invention includes a processor requiring at least one bias voltage, and further includes a companion voltage regulator for providing the bias voltage. The voltage regulator is arranged sufficiently proximate to the processor, so as to limit inductance of electrical coupling therebetween.

23 Claims, 3 Drawing Sheets

COLD PLATE ARRANGEMENT FOR COOLING PROCESSOR AND COMPANION VOLTAGE REGULATOR

CROSS REFERENCE TO RELATED APPLICATION

This is a continuation-in-part of copending application Ser. No. 08/902,770 filed Jul. 30, 1997.

FIELD OF THE INVENTION

The present invention relates to cooling of electronic components and more particularly to a cold plate arranged for simultaneously cooling a processor and its companion voltage regulator.

BACKGROUND OF THE INVENTION

Operation of high speed electronic components produces unwanted heat. For example, high speed computer processor elements such as microprocessors, graphics processors and the like generate unwanted heat that must be removed for efficient operation. Heat removal provides for a lower operating temperature, higher operating speeds and greater computing power. Additional advantages include higher reliability and availability.

To meet ever higher requirements for computing power, processor designs continue to evolve, becoming more complex and operating at ever higher speeds. More complex designs integrate greater and greater numbers of transistors, which each contribute to generation of more heat during operation. As each transistor is operated at higher speeds, heat generation is further increased.

Various cooling schemes are known in the prior art. In general, as cooling schemes become more efficient at removing heat, mechanisms to implement the schemes become larger, heavier, bulkier and more difficult to arrange in computer systems.

While high speed computer systems are blessed with tremendous computing power, they are also twice cursed: first they are cursed with the demanding cooling requirement of the high speed processors; and second they are cursed with even more demanding requirements for one or more specialized companion voltage regulators and high speed memories carefully arranged proximate to the high speed processors.

In some processor cooling schemes of the prior art, the bulky mechanisms for implementing the schemes interfere with advantageous arrangement and placement of the companion voltage regulator and memory for highest possible operating speed. For example, such bulky mechanisms have interfered when designers have pursued a substantially co-planar arrangement of the processor and voltage regulator extending across the surface of a motherboard. This problem is exacerbated by the introduction of additional bulky mechanisms for cooling the voltage regulator.

What is needed is an efficient and compact cooling method and apparatus arranged for simultaneously drawing heat from both a processor and from the voltage regulator, while still providing for advantageous arrangement of the voltage regulator and memory proximate to the processor for high speed operation.

SUMMARY OF THE INVENTION

The invention provides an efficient and compact cooling method and apparatus arranged for simultaneously drawing heat from both a processor and from the voltage regulator, while still providing for advantageous arrangement of the voltage regulator and memory proximate to the processor for high speed operation.

In the past, bulky cooling mechanisms have interfered when designers have pursued a substantially co-planar arrangement of the processor and voltage regulator extending across the surface of a motherboard. In contrast, the present invention provides a compact stack arrangement of voltage regulator, cold plate and processor, each advantageously arranged proximate to one another for high speed operation. The proximate arrangement also provides advantages in reduction of electrical noise (as well as corresponding reduction in requirements for use of decoupling components such as capacitors and the like.)

Briefly and in general terms the invention includes a processor requiring at least one bias voltage, and further includes a companion voltage regulator for providing the bias voltage. Electrical coupling between the voltage regulator and the processor conducts the bias voltages thereto. The voltage regulator is arranged sufficiently proximate to the processor, so as to limit inductance of the electrical coupling therebetween.

At least one cold plate is sandwiched between the processor and the voltage regulator in thermal communication therewith, and is arranged for simultaneously drawing heat from the processor and from the voltage regulator.

The invention further provides for electrical coupling between a memory and the processor, for conducting signals therebetween. The memory is arranged sufficiently proximate to the processor, so as to limit propagation delay of the signals through the electrical coupling, so as to provide for the high speed operation.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENT

Figure 1:
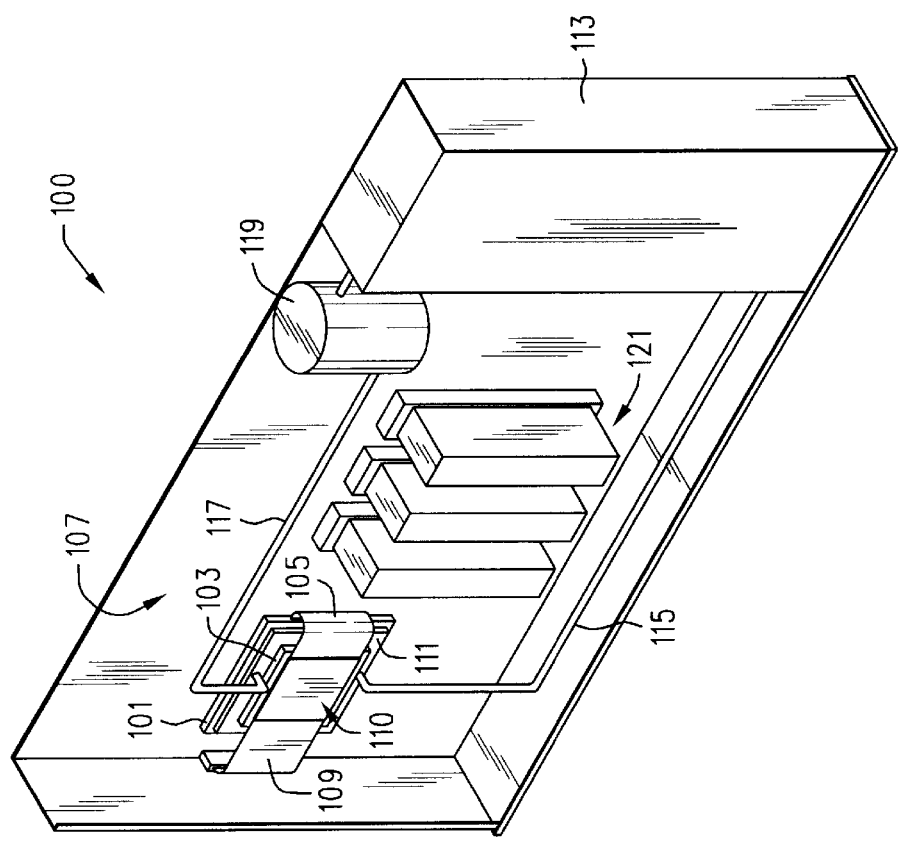
FIG. 1 is an isometric view of a preferred embodiment of the invention.

FIG. 1 is an isometric view of a preferred embodiment of the invention 100. As shown the invention includes a processor 101 requiring at least one bias voltage, and further includes a companion voltage regulator 103 for providing the bias voltage. Electrical coupling 105 between the voltage regulator and the processor conducts the bias voltages thereto. Preferably the electrical coupling 105 includes a strip of single or multilayer polymide (or polyester) based flexible printed circuit material. There are some trade-offs to be made: although multilayer strips may provide a desirable lower inductance, they are generally more expensive than single layer strips.

A source voltage is provided to the voltage regulator 103 from a supportive printed wiring board 107 through another electrical coupling 109, preferably also of the flexible printed circuit material. A square fixture of printed wiring board 110 is soldered to the voltage regulator 103 and to each of the electrical couplings 107, 109 of flexible printed circuit material, so as to provide secure electrical connection thereto. Alternatively, a so called "flying lead" may be used for connecting said another electrical coupling 109.

Additional alternative arrangements may also be used with beneficial results. For example, the invention may be practiced using a so called "power pod", which provides an integral arrangement of the voltage regulator and electrical couplings, along with any needed fixturing.

In the preferred embodiment the source voltage is forty eight volts DC (Direct Current), which is adapted by the voltage regulator to provide a selected bias voltage, typically two volts or less. It should be understood that although in some designs, a bias voltage of two volts is preferred, the principles of the invention are not limited to a particular bias voltage (or a particular source voltage).

A cold plate 111 is sandwiched between the processor 101 and the voltage regulator 103 in thermal communication therewith, and is arranged for simultaneously drawing heat from the processor and from the voltage regulator. In the preferred embodiment, the cold plate simultaneously draws up to one-hundred-and-thirty Watts (130 W) of heat from the processor 101 and up to fifty Watts (50 W) of heat from the voltage regulator 103 to maintain an operating temperature of the cold plate within a range from approximately sixty degrees Centigrade (60 C) to approximately seventy degrees Centigrade (70 C), assuming a typical ambient temperature of 35 degrees Centigrade (35 C). Although a total of up to approximately one-hundred-eighty Watts (180 W) of heat are drawn from the processor 101 and voltage regulator 103, it is theorized that the cold plate could handle much more heat, depending upon factors such as increasing rate of fluid flow. A preferred flow rate is approximately one-tenth to two-tenths of a gallon per minute for each processor cooled, however it should be understood that the invention is not limited to the preferred flow rate.

A heat exchanger 113 is thermally coupled in fluid communication with the cold plate for drawing heat therefrom. The design of the heat exchanger may be tube-in-fin, plate heat sink or other suitable design. The heat exchanger may be fabricated for a preferred copper, or from aluminum, stainless steel or composite. The cold plate and heat exchanger each include respective flow paths therethrough for circulating a cooling fluid, for example water, ethylene glycol mixed with water, fluorinerts, or other suitable fluids known to those with ordinary skill in the art.

As shown in FIG. 1, the invention includes a pair of fluid conduits 115, 117 coupled with the flow paths of the cold plate 111 and the heat exchanger 113 for circulating the fluid therebetween. In the preferred embodiment, the fluid conduits are made from quarter inch (or half inch) diameter hollow copper tubing, or another suitable material.

In the preferred embodiment, an electric pump 119 is coupled in line with one of the fluid conduits to promote circulation of the fluid. Various different electric pumps provide desirable results. It is preferred to use magnetically coupled pumps so as to seal completely the fluid circulation. Such pumps are generally available from manufacturers, for example Iwaki Welchem or Gorman Rupp.

In the preferred embodiment, memory modules 121 and the processor 101 are each soldered or otherwise electrically coupled with conductive traces of the printed wiring board 107, to provide for electrical coupling between the memory and the processor and for conducting electrical signals therebetween.

As shown in FIG. 1 the memory is arranged sufficiently proximate to the processor, so as to limit propagation delay of the signals through the electrical coupling. In the preffered embodient, each of the conductive traces providing electrical coupling between the processor controller and a respective memory controller of each memory module is substantially less than approximately forty centimeters (40 cm) in order to provide for memory access frequency as high as approximately one-hundred-and-twenty-five Megahertz (125 Mhz). To provide for an adequate timing margin for such a high memory access frequency, it is preferred that each of the conductive traces providing electrical coupling between the processor controller and a respective memory controller of each memory module is within approximately thirty-eight centimeters.

Figure 2:
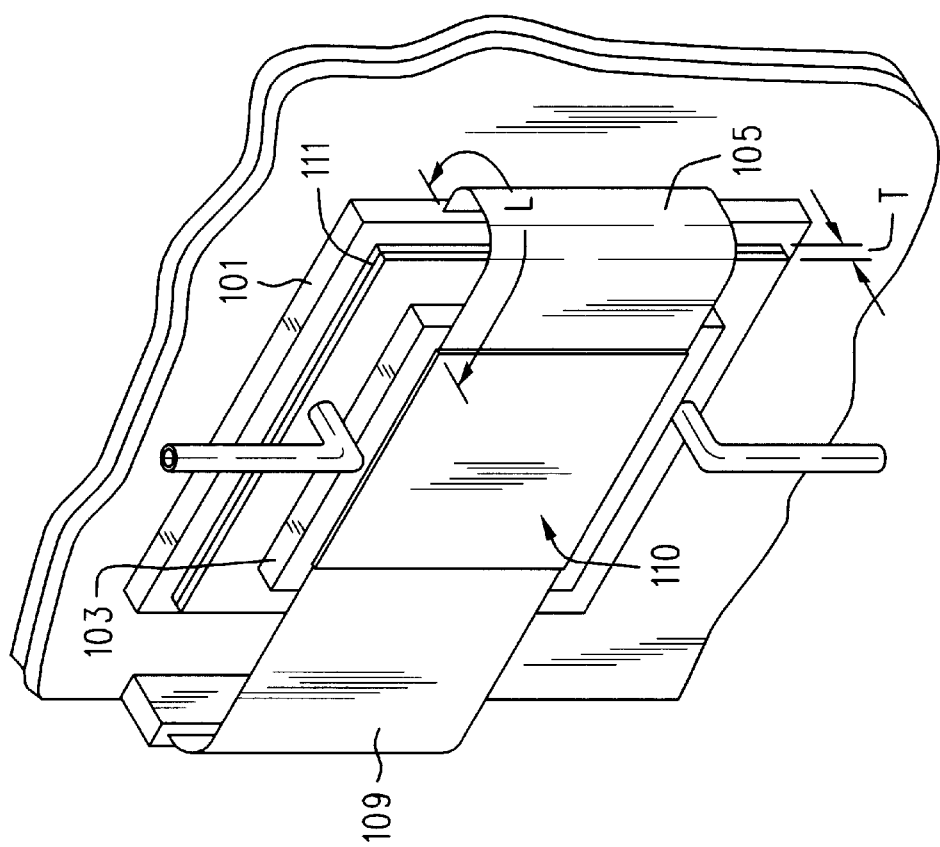
FIG. 2 is a detailed view of a sandwiched arrangement of voltage regulator, cold plate and processor shown in FIG. 1.

FIG. 2 is a detailed view of a sandwiched arrangement of voltage regulator 103, cold plate 111 and processor 101 shown in FIG. 1. The cold plate 111 has a first and second opposing major surface. The voltage regulator 103 has a major surface in thermal communication with the first major surface of the cold plate 111. The processor 101 has a major surface in thermal communication with the second opposing major surface of the cold plate 111 . In the preferred embodiment, a thin layer of thermal grease (not shown in the figures) is interposed in contact between the first major surface of the cold plate and the major surface of the voltage regulator, so as to promote heat flow. For the same reasons, another thin layer of thermal grease (not shown in the figures) is interposed in contact between the second opposing surface of the cold plate and processor. In alternative embodiments, thin thermal pads are used in place of the thermal grease with beneficial results.

The voltage regulator 103 is arranged sufficiently proximate to the processor, so as to limit inductance of the electrical coupling therebetween. It should be understood that the electrical coupling 105 may engage the processor as shown in the figures, or alternatively may be connected to the printed wiring board 107 at a location directly adjacent to the processor, and in turn coupled with the processor though relatively short conductive traces created for the printed wiring board 107.

A length dimension, L, of the electrical coupling 105 extending from the processor through where the square fixture of printed wiring board 110 is soldered to the voltage regulator 103 is within a range of approximately two millimeters to approximately twenty-five millimeters, so as to limit inductance of the electrical coupling 105 and so as to provide for a suitable step load current response for when the processor is operating at clock frequencies within a range of approximately one Gigahertz (or higher) down to approximately two-hundred-forty Megahertz. In the preferred embodiment, the length of the electrical coupling between the voltage regulator and the processor is approximately four millimeters, so as to provide for suitable step load current response for when the processor is operating at clock frequencies of up to approximately five-hundred Megahertz.

Accordingly, The proximate arrangement of the voltage regulator with the processor is within a range of approximately two millimeters to approximately twenty-five millimeters. In the preferred embodiment, the proximate arrangement of the voltage regulator with the processor is approximately four millimeters.

For the same reasons just discussed, inductance of the electrical coupling between the voltage regulator and the processor is within a range of approximately point-one-five (0.15) nanohenries (for the one Gigahertz clock frequency)

to approximately point-six (0.6) nanohenries (for the two-hundred-forty Megahertz clock frequency). In the preferred embodiment the inductance of the electrical coupling between the voltage regulator and the processor is approximately point-three (0.3) nanohenries (corresponding to the five-hundred Megahertz clock frequency).

A total thickness dimension, T, of the cold plate 111 sandwiched between the voltage regulator and processor is sufficiently thin so as to provide for the proximate arrangement of the voltage regulator with the processor. The total thickness of the cold plate is within a range of approximately two (2) millimeters to approximately seven (7) millimeters.

The reason that the total thickness, T, should be greater than the first limit of approximately two (2) millimeters is related to limitations in fabrication of the cold plate. In preferred embodiment, the cold plate is fabricated from a clam-shell arrangement of two thinner constituent plates sealed together and having a serpentine channel or cavity extending therethrough for circulating the cooling fluid for heat transfer. It is theorized by the inventor for efficient heat transfer to the fluid, the serpentine channel should have a preferred diameter within a range from approximately point-one-six (0.16) inch to approximately point-two (0.2) inch diameter. Though some beneficial results may be achieved with smaller channel diameters, these preferred channel diameters require that the total thickness, T, of the two plates together is substantially greater than approximately two (2) millimeters, to maintain structural integrity of the constituent plates and efficient heat transfer from the constituent plates.

The reason that the total thickness, T, should be less than the second limit of approximately seven (7) millimeters is related to practical limitations of overall space available for the processor/cold plate/voltage regulator sandwich. The preferred total thickness, T, of the cold plate is approximately four (4) millimeters, to provide an advantageous balance between the available space and both the thermal efficiency and the structural integrity of the constituent plates.

The cold plate should be large enough for thermal coupling with the processor and voltage regulator, and furthermore should be large enough to provide for coupling to the fluid conduits. For example, in the case the major surface of the processor having width and depth dimensions of approximately three (3) inches by approximately five (5) inches, it is preferred that each of the opposing major surfaces of the cold plate have width and depth dimensions of approximately three-point-seven-five (3.75) inches by approximately five-point-seven-five (5.75) inches. In the foregoing example, it is presumed that the major surface of the voltage regulator has width and depth dimensions of approximately two-point-four (2.4) inches by approximately four-point-six (4.6) inches. Of course, it should be understood that size of the cold plate is varied for different size processors and voltage regulators, in accordance with the principles of the invention.

Figure 3:
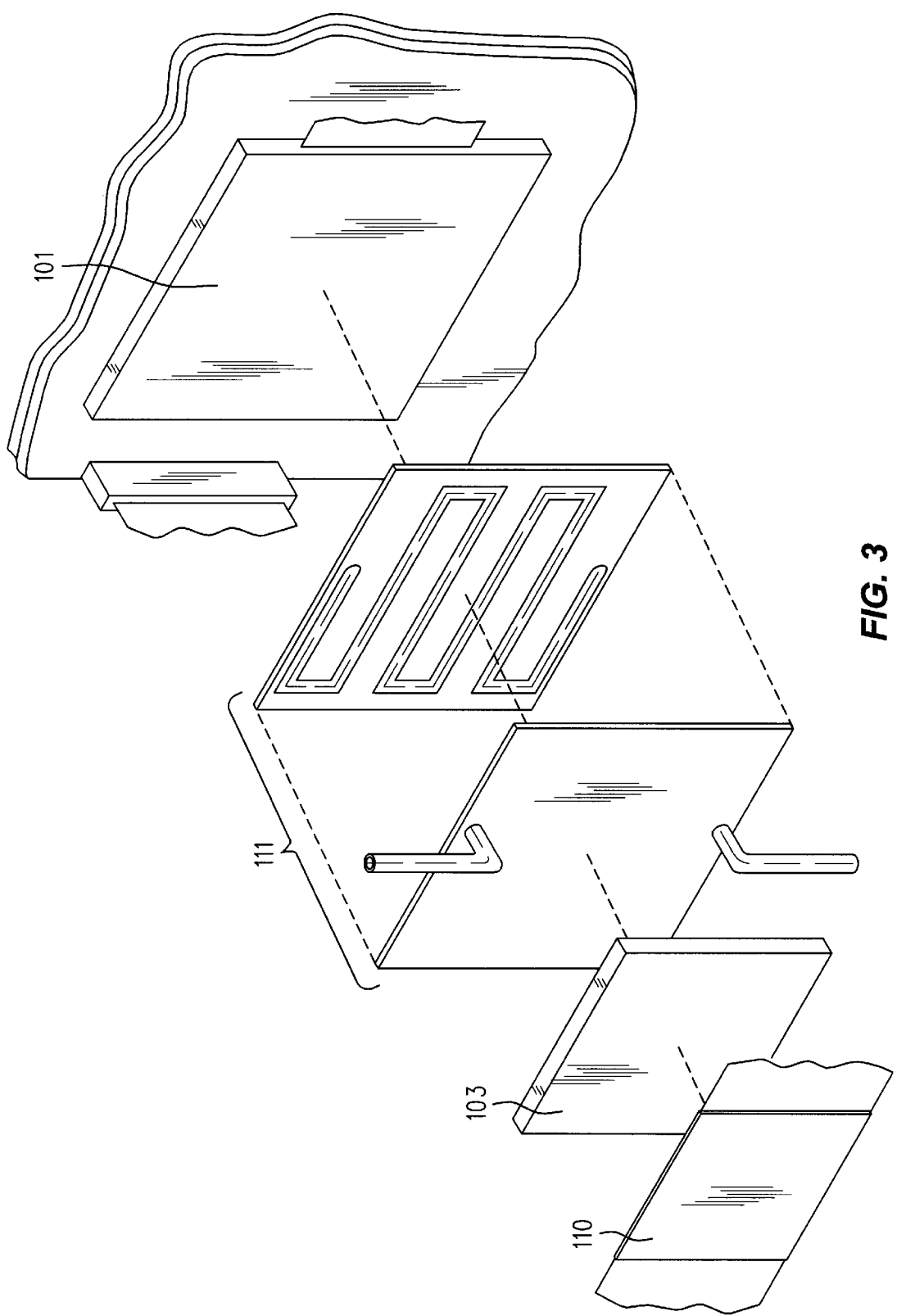
FIG. 3 is an exploded view of the sandwiched arrangement shown in FIG. 2.

FIG. 3 is an exploded view of the sandwiched arrangement of FIG. 2, showing the square fixture of printed wiring board 110, the voltage regulator 103 and the processor 101. For the cold plate 111, its clam-shell arrangement of two thinner constituent plates sealed together are shown for illustrative purposes in FIG. 3 as exploded apart, so as to reveal the serpentine channel extending therethrough for circulating the cooling fluid. In the preferred embodiment, the serpentine channel is machined to extend into the constituent plates, which may be made of copper, aluminum, stainless steel or composite. Copper is preferred to resist corrosion. A preferred length of the channel is approximately twenty inches long. The constituent plates are brazed to seal the cold plate against any unwanted leakage of the fluid.

It should be understood that alternate arrangements of the channel may be made with beneficial results, depending on what temperature of the cold plate is desired. In an alternative embodiment, instead of a serpentine channel, folded finstock used to provide for the circulation of the fluid. The folded finstock is brazed between two constituent plates of the cold plate, to seal the cold plate against the unwanted leakage.

As discussed, the invention provides an efficient and compact cooling method and apparatus arranged for simultaneously drawing heat from both a processor and from the voltage regulator, while still providing for advantageous arrangement of the voltage regulator and memory proximate to the processor for high speed operation. Within the scope of the appended claims, therefor, the invention may be practiced otherwise than as specifically described and illustrated.

What is claimed is:

1. An apparatus comprising:
    a processor requiring at least one bias voltage;
    a voltage regulator for providing the bias voltage; electrical coupling between the voltage regulator and the processor for conducting the bias voltages thereto; and
    at least one cold plate sandwiched between the processor and the voltage regulator and in thermal communication therewith and arranged for simultaneously drawing heat from the processor and from the voltage regulator, wherein a thickness dimension of the cold plate is within a range of approximately two millimeters to approximately seven millimeters.

2. An apparatus as in claim 1 wherein:
    the cold plate has a first and second opposing major surface;
    the voltage regulator has a major surface in thermal communication with the first major surface of the cold plate; and
    the processor has a major surface in thermal communication with the second major surface of the cold plate.

3. An apparatus as in claim 1 wherein there is a proximate arrangement of the voltage regulator with the processor, so as to limit inductance of the electrical coupling therebetween.

4. An apparatus as in claim 3 wherein the proximate arrangement of the voltage regulator with the processor is within a range of approximately two millimeters to approximately twenty-five millimeters.

5. An apparatus as in claim 4 wherein the proximate arrangement of the voltage regulator with the processor is approximately four millimeters.

6. An apparatus as in claim 1 wherein a length of the electrical coupling between the voltage regulator and the processor is within a range of approximately two millimeters to approximately twenty-five millimeters, so as to limit inductance of the electrical coupling.

7. An apparatus as in claim 6 wherein the length of the electrical coupling between the voltage regulator and the processor is approximately four millimeters.

8. An apparatus as in claim 1 wherein an inductance of the electrical coupling between the voltage regulator and the processor is within a range of approximately point-one-five nanohenries to approximately point-six nanohenries.

9. An apparatus as in claim 8 wherein the inductance of the electrical coupling between the voltage regulator and the processor is approximately point-three nanohenries.

10. An apparatus as in claim 3 wherein a thickness dimension the cold plate sandwiched between the voltage regulator and processor is sufficiently thin so as to provide for the proximate arrangement of the voltage regulator with the processor.

11. An apparatus as in claim 1 further comprising a heat exchanger thermally coupled with the cold plate for drawing heat therefrom.

12. An apparatus as in claim 11 wherein the heat exchanger is in fluid communication with the cold plate.

13. An apparatus as in claim 11 wherein:
   the cold plate and heat exchanger each include respective flow paths therethrough for circulating a fluid; and
   the apparatus further includes a pair of fluid conduits coupled with the flow paths of the cold plate and the heat exchanger for circulating the fluid therebetween.

14. An apparatus as in claim 1 wherein:
   the apparatus further comprises a memory; and
   electrical coupling between the memory and the processor for conducting signals therebetween; and
   wherein there is a proximate arrangement of the memory with the processor, so as to limit propagation delay of the signals through the electrical coupling.

15. An apparatus as in claim 14 wherein the proximate arrangement of the memory with the processor is substantially less than approximately forty centimeters.

16. An apparatus as in claim 15 wherein the proximate arrangement of the memory with the processor is within approximately thirty-eight centimeters.

17. An apparatus as in claim 14 wherein a length of the electrical coupling between the memory and the processor is substantially less than approximately forty centimeters.

18. An apparatus as in claim 17 wherein the length of the electrical coupling between the memory and the processor is within approximately thirty-eight centimeters.

19. A method comprising the steps of:
   providing a voltage regulator, a processor and electrical coupling for conducting at least one bias voltage therebetween;
   sandwiching a cold plate between the processor and the voltage regulator and in thermal communication therewith so that a thickness of the cold plate separating the processor and the voltage regulator is within a range of approximately two millimeters to approximately seven millimeters; and
   using the cold plate to simultaneously draw heat from the processor and from the voltage regulator.

20. A method as in claim 19 further comprising the step of arranging of the voltage regulator sufficiently proximate to the processor, so as to limit inductance of the electrical coupling therebetween.

21. A method as in claim 19 further comprising the steps of:
   providing a memory and electrical coupling between the memory and the processor for conducting signals therebetween;
   arranging of the memory proximate to the processor, so as to limit propagation delay of the signals through the electrical coupling.

22. An apparatus comprising:
   a processor requiring at least one bias voltage;
   a voltage regulator for providing the bias voltage;
   electrical coupling between the voltage regulator and the processor for conducting the bias voltages thereto;
   at least one cold plate sandwiched between the processor and the voltage regulator and in thermal communication therewith and arranged for simultaneously drawing heat from the processor and from the voltage regulator, wherein a thickness dimension of the cold plate is within a range of approximately two millimeters to approximately seven millimeters; and
   at least one memory, wherein the sandwiched processor, voltage regulator and cold plate are supported by a printed wiring board along with the memory.

23. An apparatus as in claim 22, comprising:
   a heat exchanger coupled with the cold plate; and
   a pump, the heat exchanger and the pump being supported by the printed wiring board.

* * * * *

UNITED STATES PATENT AND TRADEMARK OFFICE
CERTIFICATE OF CORRECTION

PATENT NO.    : 6,191,945 B1
DATED         : February 20, 2001
INVENTOR(S)   : Christian L. Belady et al.

It is certified that error appears in the above-identified patent and that said Letters Patent is hereby corrected as shown below:

<u>Column 7,</u>
Line 6, delete "is sufficiently thin so" and insert therefor -- so dimensioned --

Signed and Sealed this

Seventeenth Day of August, 2004

JON W. DUDAS
*Acting Director of the United States Patent and Trademark Office*